(12) United States Patent
Moharir

(10) Patent No.: US 9,672,904 B1
(45) Date of Patent: Jun. 6, 2017

(54) 6T BITCELL FOR SINGLE PORT STATIC RANDOM ACCESS MEMORIES (SRAM) WITH SINGLE-ENDED READ AND SINGLE-ENDED WRITE

(71) Applicant: Skan Technologies Corporation, Willowbrook, IL (US)

(72) Inventor: Sudhir S. Moharir, Bangalore (IN)

(73) Assignee: SKAN TECHNOLOGIES CORPORATION, Willowbrook, IL (US)

( * ) Notice: Subject to any disclaimer, the term of this patent is extended or adjusted under 35 U.S.C. 154(b) by 0 days.

(21) Appl. No.: 15/373,633

(22) Filed: Dec. 9, 2016

Related U.S. Application Data

(60) Division of application No. 14/976,723, filed on Dec. 21, 2015, which is a continuation-in-part of application No. 14/519,468, filed on Oct. 21, 2014, now Pat. No. 9,336,861.

(60) Provisional application No. 62/036,189, filed on Aug. 12, 2014.

(51) Int. Cl.
 G11C 11/419 (2006.01)
 G11C 5/06 (2006.01)
 G11C 11/418 (2006.01)

(52) U.S. Cl.
 CPC ............ *G11C 11/419* (2013.01); *G11C 5/063* (2013.01); *G11C 11/418* (2013.01)

(58) Field of Classification Search
 CPC ...... G11C 11/419; G11C 11/418; G11C 5/063
 See application file for complete search history.

(56) References Cited

U.S. PATENT DOCUMENTS

| | | | | |
|---|---|---|---|---|
| 6,674,660 B2 * | 1/2004 | Shau | ............ | G11C 15/04 365/156 |
| 7,064,971 B2 * | 6/2006 | Shau | ............ | G11C 15/04 365/195 |

\* cited by examiner

*Primary Examiner* — Tri Hoang
(74) *Attorney, Agent, or Firm* — Anderson Gorecki LLP

(57) ABSTRACT

A 6T bitcell for single port SRAM that performs single ended read and single ended write is described. The presently described bitcell gives huge advantage in terms of area, dynamic power, leakage power and performance over the prior art in the industry. The bitcell and architecture does not have either a write bitline pair or a read bitline for each bitcell. It has only one read bitline per mux.

12 Claims, 5 Drawing Sheets

6T BITCELL FOR SINGLE PORT STATIC RANDOM ACCESS MEMORIES (SRAM) WITH SINGLE-ENDED READ AND SINGLE-ENDED WRITE

CROSS REFERENCE TO RELATED APPLICATIONS

The present application is a Divisional of U.S. patent application Ser. No. 14/976,723, filed on Dec. 21, 2015 which claims priority to Continuation-In-Part of U.S. patent application Ser. No. 14/519,468, filed on Oct. 21, 2014, issued U.S. Pat. No. 9,336,861, issued on May 5, 2016 which claims priority to U.S. Provisional Patent Application No. 62/036,189 filed on Aug. 12, 2014, and to U.S. Provisional Patent Application 62/098,460 filed on Dec. 31, 2014, to U.S. Provisional Patent Application 62/097,270 filed on Dec. 29, 2014 and to U.S. Provisional Patent Application 62/098,492 filed Dec. 31, 2014 all of which are incorporated herein by reference in their entirety.

BACKGROUND

Traditional memory bit cells are well known and widely used. In a conventional six transistor (6T) bitcell, in order to write into the bitcell, a Write Line (WL) needs to go high and the zero is written either from the Bit Line (BL) or the Bit Line Bar (BLB) side by pulling either the BL or the BLB low depending on the data. The READ happens by sensing the differential between the BL and BLB when the WL goes high. In a conventional eight transistor (8T) bitcell the WRITE operation is same as in the 6T bitcell. The READ operation happens when the RWL goes high. The Read Bit Line (RBL) is precharged high. If the node B is high, then the RBL will go low, otherwise it will stay high.

SUMMARY

In the earlier memory bitcell architectures, in order to accomplish a write to the bit cell a write bitline, a write column mux comprised of the NMOS pass transistors, and a write driver were required. As the write driver had to drive the bitline through the write mux pass transistor, the size of the write driver needed to be bigger and the statistical analysis had to be carried out on the combination of bitline RC, write mux and the write driver. This increased the problem of writing into the bitcell and contributed to the necessity of the write-assist techniques. In accordance with the present invention, the writing into the bitcell is now made simple, and there would be many technology nodes where the necessity of the write-assist techniques will not be there. The write-assist requirement is also taken care of.

In the previous patents with Ser. Nos. 62/036,189 and 14/519,468, a 9T bitcell for 1R1W (One Read One Write) SRAM memories with single-ended read and single-ended write was described.

Conventional memory bit cells suffer from a number of deficiencies as recited above. Embodiments of the invention significantly overcome such deficiencies by providing a bitcell and memory architecture without a write bitline.

A 6T bitcell for single port SRAM that performs single ended read and single ended write is described. The present invention provides advantages in terms of area, dynamic power, leakage power and performance over the prior art in the industry. The bitcell and architecture does not have either a write bitline pair or a read bitline for each bitcell. It has only one read bitline per mux.

The conventional bitcell with single ended read is an 8T bitcell. The presently described bitcell which gives single ended read as well as single ended write has just 6 transistors. This gives area advantage. This bitcell also exhibits almost all the advantages of the bitcells earlier described in the patents quoted above.

Note that each of the different features, techniques, configurations, etc. discussed in this disclosure can be executed independently or in combination. Accordingly, the present invention can be embodied and viewed in many different ways. Also, note that this summary section herein does not specify every embodiment and/or incrementally novel aspect of the present disclosure or claimed invention. Instead, this summary only provides a preliminary discussion of different embodiments and corresponding points of novelty over conventional techniques. For additional details, elements, and/or possible perspectives (permutations) of the invention, the reader is directed to the Detailed Description section and corresponding figures of the present disclosure as further discussed below.

BRIEF DESCRIPTION OF THE DRAWINGS

The foregoing will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention. The drawings are not necessarily to scale, emphasis instead being placed upon illustrating the principles of the invention.

DETAILED DESCRIPTION

Figure 1:
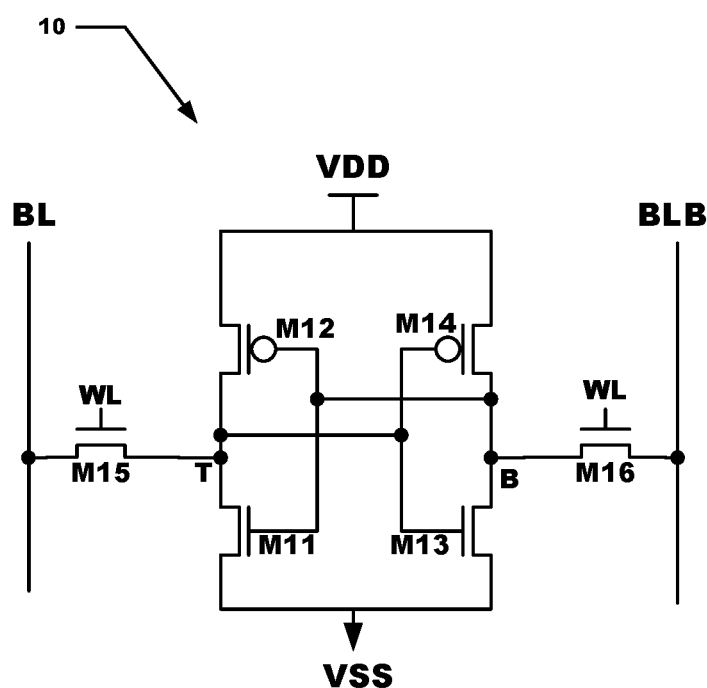
FIG. 1 depicts a schematic diagram of a conventional 6T bitcell.

The embodiments set forth below represent the necessary information to enable those skilled in the art to practice the invention and illustrate the best mode of practicing embodiments of the invention. Upon reading the following description in light of the accompanying figures, those skilled in the art will understand the concepts of the invention and recognize applications of these concepts not particularly addressed herein. It should be understood that these concepts and applications fall within the scope of the disclosure and the accompanying claims.

The preferred embodiment of the invention will now be described with reference to the accompanying drawings. The invention may, however, be embodied in many different forms and should not be construed as limited to the embodiment set forth herein; rather, this embodiment is provided so that this disclosure will be thorough and complete, and will fully convey the scope of the invention to those skilled in the art. The terminology used in the detailed description of the particular embodiment illustrated in the accompanying drawings is not intended to be limiting of the invention. In the drawings, like numbers refer to like elements.

FIG. 1 shows a conventional 6T bitcell. To write into the bitcell, the WL needs to go high and the zero is written either from the BL or the BLB side by pulling either the BL or the BLB low depending on the data. The READ happens by sensing the differential between the BL and BLB when the WL goes high.

Figure 2:
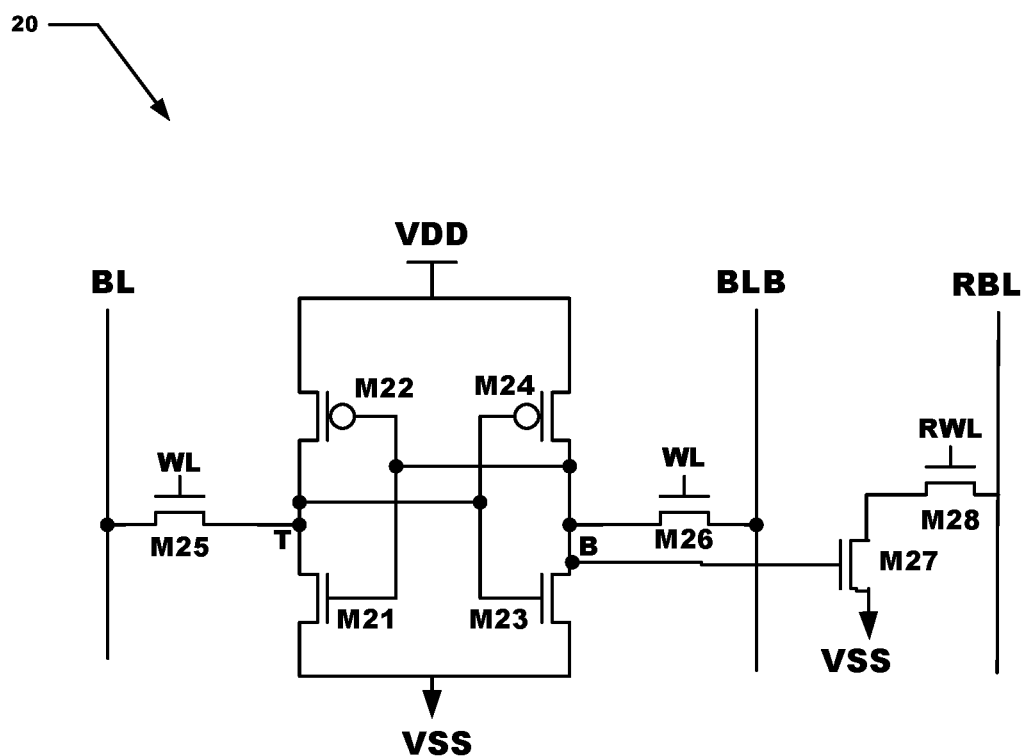
FIG. 2 depicts a schematic diagram of a conventional 8T bitcell.

FIG. 2 shows a conventional 8T bitcell. The WRITE operation is same as in the 6T bitcell. The READ operation happens when the RWL goes high. The RBL is precharged high. If the node B is high, then the RBL will go low, otherwise it will stay high.

Figure 3:
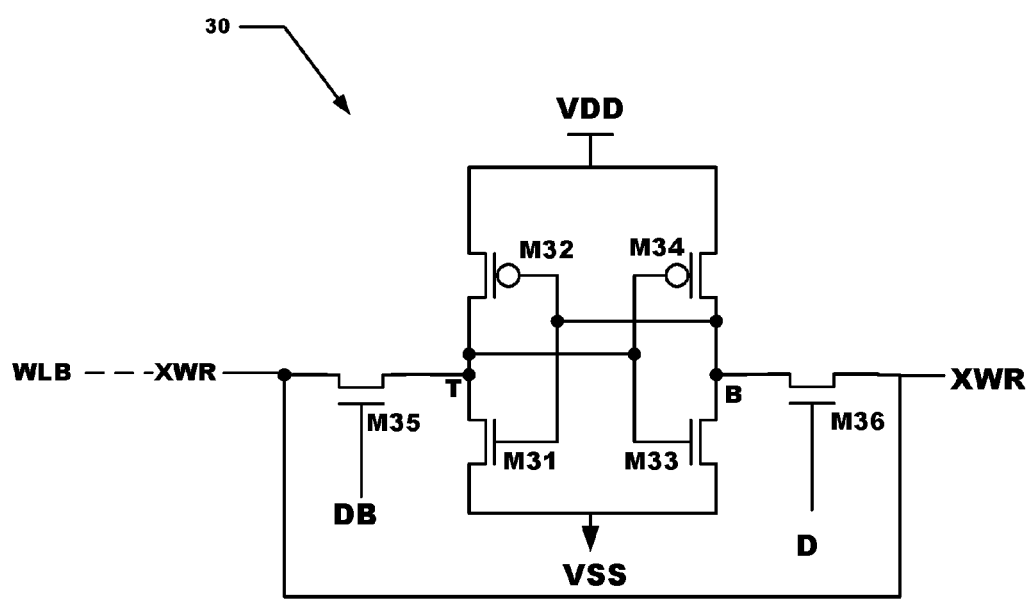
FIG. 3 depicts a schematic diagram of a 6T bitcell in accordance with a particular embodiment of the present invention.

Refer to FIG. 3, this bitcell 30 can be used as a 6T bitcell for single port memories with single ended read and single ended write. When neither READ nor WRITE operation is happening, WL (Word Line), DB (Data Bar), and D (Data) are kept low. Signal WL is not used in FIG. 3. WL is generated in the leafcell called WD (Wordline Driver) and WLB which is used in FIG. 3 is the inverted version of WL. When the bitcell is not accessed, WLB stays high. As the access passgates, M35 and M36 are OFF, any READ or WRITE operation does not happen. To write into the bitcell, the WL goes high, WLB goes low, and either DB or D will go high, depending on the data polarity. If WL and DB are high, then the node T will be pulled low. If WL and D are high, then the node B will be pulled low. This is how we write into the bitcell. Note that a conventional write driver which drives the write bitline in conventional architectures is not required. Consequently, write bitline precharge is not required. Even during a WRITE operation, either T or B will be exposed to the outside influence. Other bitcells on the same wordline WL are not exposed to the outside influence because for those bitcells, both DB and D will be OFF. In the conventional bitcells, both T and B for all the bitcells on the wordline are exposed to the outside influence. Note that the D and DB signals which control the write pass transistors of the 6T bitcell will have the "data" and the column address information encoded in them. For an unselected column, both D and DB will always stay low.

The bitcell shown in FIG. 3 can be used for single ended READ also. During the READ cycle, The WLB driver will be disconnected from the node XWR. Now, if DB goes high, XWR will fall if the node T is at "zero". For DB high and node T at "one", the XWR will stay high. This is how the data stored in the bitcell can be read from the "DB" passgate side. The node XWR can be sensed by a simple invertor or any other single ended sense amplifier. If D goes high, XWR will fall if the node F is at "zero". For D high and node F at "one", the XWR will stay high. This way, the bitcell can be read from the "D" passgate side. The polarity of the final output "Q" needs to be adjusted based on the side of the bitcell that is used to read the bitcell contents.

Figure 4:
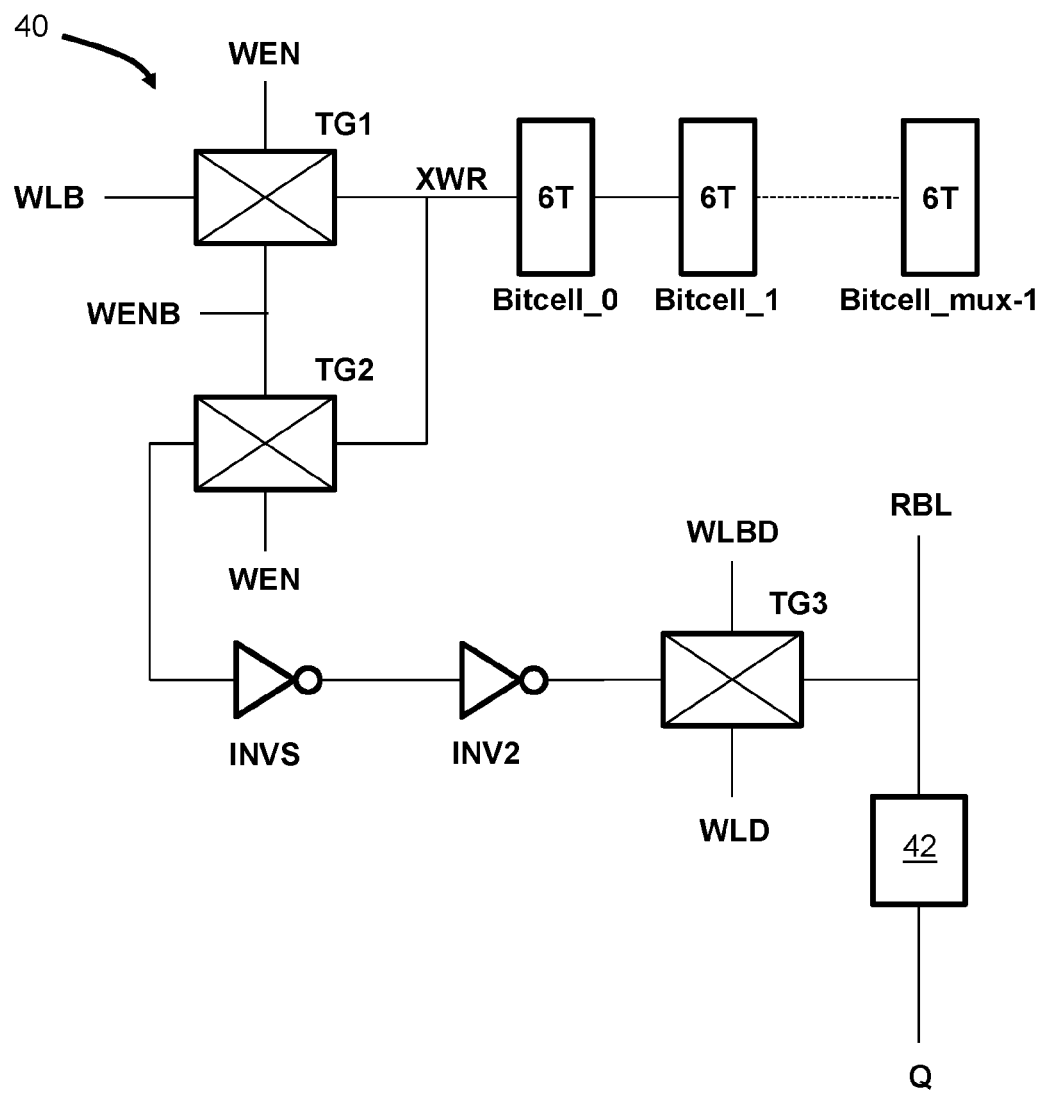
FIG. 4 depicts a block diagram of a particular embodiment of a row of 6T bitcells in accordance with a particular embodiment of the present invention.

A top level block diagram of how the single ended READ and single ended WRITE operation can happen with this 6T bitcell is shown in FIG. 4.

A slice of columns is formed having a size of "column mux". For example, if the column mux is 8, then the slice has 8 columns. This is because there is a need to read only one bitcell per mux on any given wordline WL. FIG. 4 shows single ended READ. Either DB or D will be ON and the data will be read from one side only. INVS (Invertor Sensing) will sense the data and will put on the RBL only if the WL is active for that row; otherwise not.

When WEN (Write Enable) is low, a write operation is performed as TG1 is ON and TG2 is OFF. When WEN is high, a read operation is performed as TG1 is OFF and TG2 is ON. In an alternative scheme (not shown in FIG. 4), the TG2 gate can be controlled with a combination of WEN and WEB signals so that it will be ON only during a read operation and only when the WL is ON, otherwise not. The INVS invertor can be tristated with the WLB signal so that it will not switch unless the WL is selected. In short, there are multiple ways to reduce the switching logic during a read operation.

The output of INV2 will drive the RBL only if the corresponding WL is ON. For all other unselected WL, the output of INV2 will not drive RBL as the transmission gate T3 will be OFF. Here, there is only one RBL per mux and the final output Q can be taken from RBL directly or with buffering and keeper latch 42 as per the design requirements.

Figure 5:
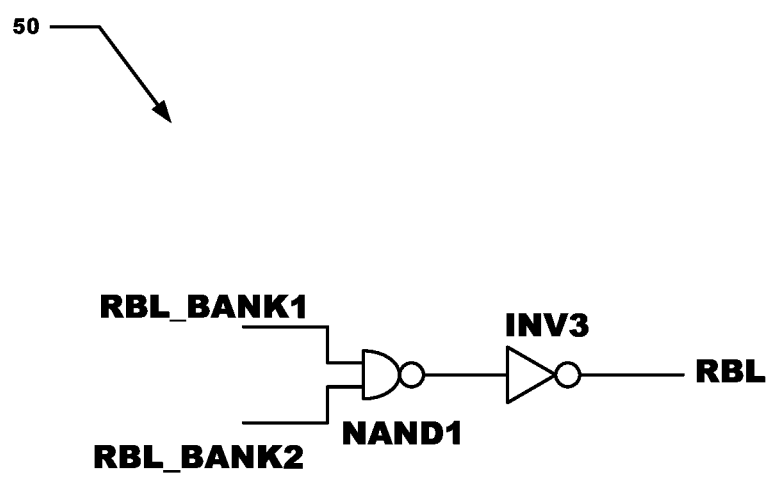
FIG. 5 depicts a schematic diagram of a particular embodiment of an RBL Driver in accordance with a particular embodiment of the present invention.

If number of rows is high, then hierarchy can be added on the RBL. For example, refer to FIG. 5. The RBL can be divided in smaller bitlines of rows 32 or 64, etc. The designer needs to keep track of the data polarity. Additional sensing circuitry can be added in the layout in a small slice between the two muxes without taking much of the area. A substrate tap can be added in the slice area.

One advantage of the described design is that there is only one RBL per mux. Therefore muxing is not required towards the Q output. At the same time, if the number of columns per mux is high, say for mux64, then a slice can be added after every 8 or 16 columns and then mux the RBLs at the bottom of the instance to get the final Q output. These are minor architectural changes that the designer can always do based on the PPA requirements.

One more advantage of this architecture is that it is very easy to implement the bitwrite functionality. Bitwrite is a condition where one can selectively write into a part of the full word and the read operation will happen on the remaining part of the word. As shown in FIG. 4, the read or write operation of each mux can be controlled separately. So based on the bitwrite requirement, we can control the transmission gates TG1 and TG2 to perform either read or write on a given mux or bit.

Unless otherwise stated, use of the word "substantially" may be construed to include a precise relationship, condition, arrangement, orientation, and/or other characteristic, and deviations thereof as understood by one of ordinary skill in the art, to the extent that such deviations do not materially affect the disclosed methods and systems.

Throughout the entirety of the present disclosure, use of the articles "a" or "an" to modify a noun may be understood to be used for convenience and to include one, or more than one of the modified noun, unless otherwise specifically stated.

Elements, components, modules, and/or parts thereof that are described and/or otherwise portrayed through the figures to communicate with, be associated with, and/or be based on, something else, may be understood to so communicate, be associated with, and or be based on in a direct and/or indirect manner, unless otherwise stipulated herein.

Although the methods and systems have been described relative to a specific embodiment thereof, they are not so limited. Obviously many modifications and variations may become apparent in light of the above teachings. Many additional changes in the details, materials, and arrangement of parts, herein described and illustrated, may be made by those skilled in the art.

Having described preferred embodiments of the invention it will now become apparent to those of ordinary skill in the art that other embodiments incorporating these concepts may be used. Accordingly, it is submitted that that the invention should not be limited to the described embodi-

What is claimed is:

1. A memory datapath architecture comprising:
   a plurality of transistors arranged to form a bit cell, said bit cell comprising a first transistor, a second transistor, a third transistor and a fourth transistor configured to store a bit of data;
   a fifth transistor having a gate coupled to a Data Bar (DB) signal, said fifth transistor having a drain coupled to a drain of said first transistor (Node T) and a Source coupled to an XWR node also selectively connected to a Word Line Bar (WLB) signal;
   a sixth transistor having a gate coupled to a Data (D) signal, a drain coupled to a drain of said third transistor (Node B) and a source coupled to a source of said fifth transistor and to said XWR node; and
   wherein said bit cell comprises:
      said first transistor of said plurality of transistors having a gate coupled to a gate of said second transistor of said plurality of transistors, a drain of said third transistor of said plurality of transistors, and a drain of said fourth transistor of said plurality of transistors, said first transistor having a source connected to said ground and a drain coupled to a drain of said second transistor, a gate of said third transistor and a gate of said fourth transistor;
      said second transistor having a source coupled to a positive reference voltage;
      said third transistor having a source connected to said ground; and
      said fourth transistor having a source coupled to said positive reference voltage;
      wherein said plurality of transistors are arranged to form a row-slice of bit cells,
      wherein said bit cells are connected in electrically parallel configuration so that the XWR nodes of all the bitcells are connected to each other, wherein said XWR signal is further selectively connected to said WLB signal through a switch TG1 (Transmission Gate 1), wherein said XWR signal is selectively connected to a sense invertor INVS through a switch TG2 (Transmission Gate 2), wherein an output of the said INVS is connected to an input of another invertor INV2, and wherein an output of the said INV2 is selectively connected to a signal RBL (Read Bit Line) through a switch TG3 (Transmission Gate 3).

2. The datapath architecture of claim 1 wherein a maximum number of bitcells in a row-slice can be equal to a number of column mux factor used.

3. The datapath architecture of claim 1 wherein a minimum number of row-slices in a row equals a number of bits.

4. The datapath architecture of claim 1 wherein the said switches TG1, TG2, and TG3 can be the transmission gates or any other type of switches including the tri-statable invertors and wherein an inverting or non-inverting nature of the switch has to be considered and keeper latches are to be added at the output of the tri-statable invertors.

5. The datapath architecture of claim 1 wherein said invertor INVS can be converted into a tri-statable invertor controlled by said WLB signal to reduce the switching logic.

6. The datapath architecture of claim 1 wherein said TG1 and said TG2 are controlled by a WEN (Write Enable) and a WENB (Write Enable Bar) signals and said TG3 is controlled by a WLD (Word Line Delayed) and a WLBD (Word Line Bar Delayed) signals.

7. The datapath architecture of claim 1 wherein the said switch TG1, said switch TG2, and said switch TG3 can be appropriately controlled by a combination of said WLB and a WEN (Write Enable) signals.

8. The datapath architecture of claim 1 wherein said RBL line is pre-charged high and to perform a read of data from said bit cell, a WL (word line) line goes high.

9. The datapath architecture of claim 1 wherein said RBL line is pre-charged low and to perform a read of data from said bit cell, a WL (word line) line goes high. This is feasible by changing the polarity of the read output; for example, by replacing said INV2 by a short.

10. The datapath architecture of claim 1 wherein single ended READ and single ended WRITE both can be done using a 6T (6-Transistor) bitcell of claim 1.

11. The datapath architecture of claim 1 wherein there is only one RBL per mux and a final output Q can be taken from RBL directly or with buffering and a keeper latch.

12. The datapath architecture of claim 1 wherein only one sense input is generated for said row-slice and only one sense output is generated for said row-slice.

* * * * *